United States Patent
Rincon et al.

(10) Patent No.: US 6,970,005 B2
(45) Date of Patent: Nov. 29, 2005

(54) MULTIPLE-CHIP PROBE AND UNIVERSAL TESTER CONTACT ASSEMBLAGE

(75) Inventors: Reynaldo M. Rincon, Richardson, TX (US); Richard W. Arnold, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 566 days.

(21) Appl. No.: 09/915,919

(22) Filed: Jul. 26, 2001

(65) Prior Publication Data

US 2002/0043980 A1 Apr. 18, 2002

Related U.S. Application Data

(60) Provisional application No. 60/228,070, filed on Aug. 24, 2000.

(51) Int. Cl.$^7$ .............................................. G01R 31/06

(52) U.S. Cl. ....................... 324/754; 324/761

(58) Field of Search ................ 324/754–765, 324/158.1; 439/480–782; 29/592–593, 846, 29/854

(56) References Cited

U.S. PATENT DOCUMENTS

| | | | |
|---|---|---|---|
| 6,215,320 B1 * | 4/2001 | Parrish | 324/754 |
| 6,218,910 B1 * | 4/2001 | Miller | 333/33 |
| 6,799,976 B1 * | 10/2004 | Mok et al. | 439/55 |

* cited by examiner

Primary Examiner—Vinh P. Nguyen
(74) Attorney, Agent, or Firm—Yingsheng Tung; Wade James Brady, III; Frederick J. Telecky, Jr.

(57) ABSTRACT

A probe card assemblage for simultaneously testing one or more integrated circuit chips including an interposer having on one surface a plurality of protruding contact elements for electrically contacting one or more chips of a wafer positioned atop a layer of compliant material, and arrayed in a pattern corresponding to a chip pads, a series of conductive vias through the electrically insulating interposer which connect the chip contact elements with an arrangement of leads terminating in a universal arrangement of connectors on the second surface, and a probe card with connectors mating to those on the interposer. The connectors on the interposer is secured are secured to those on the probe card, thereby providing a vertical probe assemblage which makes use of ultrasonic energy to minimize scrub or over travel. The universal probe card is specific to a tester configuration and common to a family of circuits to be tested.

17 Claims, 3 Drawing Sheets

MULTIPLE-CHIP PROBE AND UNIVERSAL TESTER CONTACT ASSEMBLAGE

This application claims the benefit of Provisional Application No. 60/228,070, filed Aug. 24, 2000.

FIELD OF THE INVENTION

This invention relates to the testing of integrated circuits, and more particularly to a probe card apparatus for simultaneously testing multiple integrated circuit chips.

DESCRIPTION OF PRIOR ART

Integrated circuits (ICs) are formed as multiple, identical, discrete chips on a semiconductor crystal wafer. Each of the integrated circuit chips is usually tested to determine whether or not it functions as intended prior to cutting the semiconductor wafer into individual chips. Typically, the chips are tested by computer operated test apparatus that exercises the circuits on the chips, using a testing process commonly referred to as multiprobe testing.

Conventional multiprobe testing employs a probe card which includes a plurality of electrical leads terminating in needles, which in turn make contact with input/output contacts of the various circuit elements on an integrated circuit chip under test. The chip contacts most often are the pads to be electrically connected to the next level of circuitry, and are called bond pads. In prior art, it is typical for probe cards to be built by attaching metal needles, such as tungsten or tungsten-rhenium to conductive traces on a polymeric ring. The needles or probe elements may be secured to the ring by an adhesive or they may be bonded, as by welding to a blade. An opening is provided in the center of the ring for the needles to extend through, and for aligning the needles to the bond pads on a chip. The card is positioned in a probe head which provides electrical connection to the controlling computer, and which mechanically brings the needles into contact with the bond pads on the chip.

The needles must all fall in the same place in order to assure that each one makes electrical contact with a specific input/output contact or bond pad on the integrated circuit. This is accomplished by bending the needles after they are mounted on the probe card, which is laborious, time consuming, and expensive. Even after such adjustment, the needles creep back into their original positions, or are moved by pressure of the needles against the chips resulting largely from a scrubbing action used to assure penetration of any oxide coating or contamination on the bond pads.

However, the close spacing necessary for testing some chips cannot be achieved with conventional needle contacts. The tight pitch of probe needles and the angles of their projection are extremely difficult to manufacture, and in turn insures a high cost. Further, maintenance of such cards adds significantly to the cycle time of testing. As a result of these issues, a number of attempts have been made to provide alternate probe card technology. Much of the newer technology often centers around thin film photolithographically defined conductor leads on polymeric membranes with plated or spring loaded contact mechanisms. Photolithographic definition of the leads adds cost to the testing procedure, not only as a result of the initial cost and multiple steps involved, but also because new artwork and masks are required for each new device and/or change, thus adding to cycle time for production. Each of these approaches must have a means for applying uniform pressure to cause the membrane to make uniform contact across the chip. The issue of uniform contact, as well as alignment is aggravated by thermal expansion of the membrane because very often the chip generates a significant amount of heat during the testing procedure.

Further, with multiple touch downs and heat, probe tips become oxidized, and may require cleaning or replacement, thus adding to the test time. Recent developments in probe tip technology have demonstrated that noble metals do not suffer from oxidation mechanisms as do tungsten and rhenium, and as a result have a more stable contact resistance. Broz, J. J., and Rincon, R., EE-Evaluation Engineering, September, 1999 and Broz, J. J., et al "Probe Contact Resistance Variations During Elevated Temperature Wafer Test", Proceedings of the $30^{th}$ IEEE- International Test Conference, Atlantic City, N.J., PP 396–405, September 1999.

However, the biggest wafer testing issue may be that of long test time. Each chip is tested sequentially, requiring realigning and repositioning the probes for each touch down. Testing complexity, and the time required varies with the circuitry, but the alignment and positioning time may equal or exceed that of the testing itself.

Further, the size of semiconductor wafers has increased, and the geometry of circuitry has decreased, resulting in an increase in the number of chips per wafer. There are multiple wafers in a production lot, and with the increased test time per wafer, processing of a lot through wafer fabrication may require less time than testing. Consequently, test time resulting in product delivery delays, as well as the cost associated with expensive tester utilization has become a very significant issue to the industry.

Because of the aforementioned issues with prior wafer probe technologies, and because of the anticipation of even more test time issues and tighter pitch of bond pads on integrated circuits of the future, it would be very advantageous to the industry to have a probe apparatus capable of significantly decreasing test time, and a means of rapidly fabricating such a device with a high density of robust contacts.

SUMMARY OF THE INVENTION

It is an object of the current invention to provide a wafer probe card assembly for testing one or more integrated circuits simultaneously, thereby significantly decreasing the time required to test a wafer.

It is an object of the invention to provide a probe card assemblage capable of making electrical contact between a high density of chip input/output contact pads, and a probe card connected to an integrated circuit (IC) tester.

It is further an object of the invention to provide a means for electrical contact between the chip contact pads, and a probe card having universal or standardized connections for a family of integrated circuit devices to be tested.

It is another object of the invention to provide a probe card contact apparatus which can be manufactured rapidly and economically.

It is yet another object of the invention to provide a probe card apparatus having a thermal expansion coefficient similar to that of the semiconductor device to be tested so that contact is not compromised as a result of chip heating during testing.

Yet another object of the current invention is to provide a reliable, high performance probe card contact apparatus.

The objectives of this invention are met by providing a probe assemblage for wafer testing including an interposer having on one surface a plurality of protruding contact elements in an arrangement corresponding to a pattern for electrically contacting one or more chips of a wafer, conductive vias through the electrically insulating interposer which connect the chip contact elements with an arrangement of contact pads on the second surface, and a probe card with mating contacts. Conductive traces on the second surface of the interposer are routed from the vias to terminate in a connector positioned in a universal or standardized pattern. The contact elements on one or both surfaces are positioned atop a compliant material in order to allow sufficient pressure to be applied for good electrical connection. The interposer is secured to a probe card having a plurality of connectors corresponding to those on the second surface of the interposer. The universal or standardized pattern on the probe card is specific to a tester configuration, and is common to a family of circuits to be tested, thereby providing a significant reduction in probe card inventory, cost avoidance, and installation time.

The probe contact elements and interposer are designed to test one or more contiguous chips simultaneously. The array is preferably no more than two chips deep so that the leads may be fanned out, and align with probe card contacts. Manufacturing capability of probe cards typically does not provide very high density contacts, as does that for integrated circuits.

High density chip contact elements are fabricated as protruding structures, such as a stud bump or micro-wire of a noble or non-oxidizing metal, and are positioned atop a compliant material, and connected to a conductive via in the interposer.

On the second surface of the interposer, the via terminates in a conductive pad which is subsequent routed to a connector element. Vias are formed either directly through the interposer, and/or stepped horizontally in order to fan out from the tightly spaced chip contacts, and provide more generously spaced second contacts. The interposer may include one or more buried metal planes as ground or other performance enhancements, and may be contacted by selected vias.

The interposer is securely attached to a universal probe card having connectors mated to those on the interposer. The probe card contact pattern is universal or standardized to a family integrated circuit device types, and to a particular tester.

Alternately, for single chip testing applications, the interposer having at least one compliant surfaces under the connectors and having contoured edges is snapped or press fit into the universal probe card providing a low cost, robust chip contact assemblage.

The foregoing and other objectives, features and advantages will become more apparent from the following detailed description of preferred embodiments of the invention which proceeds with reference to the accompanying drawings.

DETAILED DESCRIPTION OF THE INVENTION

Figure 1:
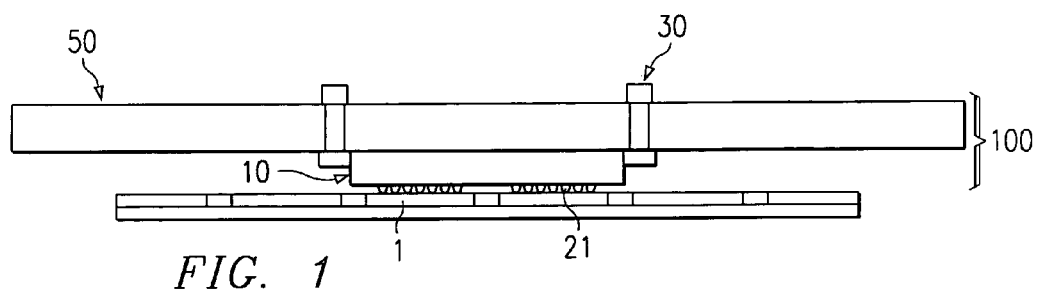
FIG. 1 is a cross section of an assemblage for testing an array of "y"×2 chips, including an interposer with contact elements and a probe card.

FIG. 1 is a multiple-chip probe assemblage 100 in accordance with the present invention. The assemblage 100 includes an interposer 10 having contact elements 21 for testing two (2) or more integrated circuit chips on a semiconductor wafer 1, a probe card 50 having universal or standardized contacts, and a means 30 to secure the interposer 10 to the probe card 50. The multiple-chip probe assemblage 100 is suitable for wafer testing at elevated temperatures. During testing of the chip sites on a wafer 1, the multiple-chip probe assemblage provides a means for contacting the input/output pads on the chips, and connecting with corresponding pads on a probe card 50 attached to a testing apparatus (not shown). The interposer of the multiple-chip probe assemblage minimizes adverse effects of thermal coefficient of expansion mismatches.

Figure 2:
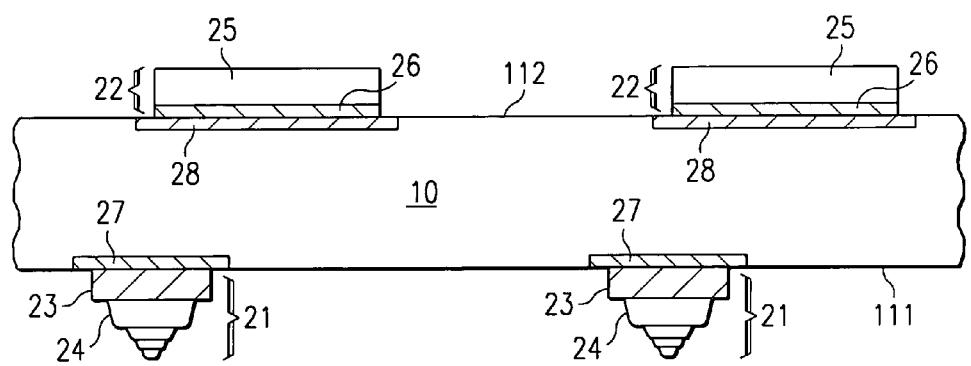
FIG. 2 is a cross section of an interposer having chip contact elements on one surface, and connection elements to a probe card on the second surface.

FIG. 2 provides a more detailed view of the interposer having contact elements on both of the major surfaces. A plurality of chip contact elements 21 protrude from the first surface 111 of the interposer 10, and a plurality of connectors 22 for electrically contacting the probe card are arrayed on the second surface 112. The chip contact elements 21 are positioned to mirror the input/output pads of one or more integrated circuit under test (not shown).

Chip contact elements 21 include a noble or non-oxidizing metal protrusion, such as a stud bump 24 seated on a metal pad 23 which is in turn positioned atop a compliant material 27. The terms noble or non-oxidizing metal are used to include those metals which may form a thin film of oxide, which is self limiting and is readily pierced by minimal contact force.

The compliant material 27 having a relatively low modulus of elasticity is recessed into the interposer under the contact element to absorb stress as contact to the chip pad is applied and thus avoid damage to either surface. A conductive via (not shown) extends through the compliant material. Alternately, in FIG. 3, the compliant material may be a film 33 across the surface of the having the metal pads and contact elements atop the film, and a via through the film. The protruding elements are preferably formed as stud bumps 24 attached by mechanical, or ultrasonic bonding equipment, similar as that used for wire bonding semiconductor devices. Stud bumping is a term applied to a metallic ball formed by a wire bonder, wherein the ball is welded to a pad, the excess wire removed and the protrusion coined or otherwise partially flattened to control the "z" axis dimension. Alternately, the chip contact elements are plated microspring wires, or other types of metallic protrusions attached to a metallized pad 24. Microspring wires technology is commercially available from Precision Art Coordinators, 22 Almeida Avenue, East Providence, R.I. 02914.

Use of non-oxidizing metal, or metal with self limiting oxidation probes has been shown to minimize the amount of scrubbing or over-travel required to make good electrical contact to aluminum or copper bond pads on integrated circuit chips. (Broz, J. J. and Rincon, Rey "Probe Contact Resistance Variations During Elevated Temperature Wafer Test", Proceedings of the International Test conference, September 1999, Atlantic City, N.J., pp 396–405.)

Patterning the pads 23 for contact elements are made by photolithography and/or laser ablation. Those features greater than 100 microns will be patterned by the photolithographic processes typically used in printed circuit and flex film technology, whereas those finer features will be either totally or partially patterned by laser ablation of unwanted metal. Software input of the design to a computer controlled fine beam laser which ablates excess metal from a metal coated surface of the interposer. Metallization is preferably a layer of tin over a copper alloy, or other low resistivity metals affixed by lamination, or vapor deposition over the first surface of the interposer. Subsequent to defining the pads, a thin film of a noble metal, preferably gold, is plated to cover the metal conductors. While a combination of photolithography and laser ablation of a metal film is the preferred method for patterning pads and leads on this device, alternatives are available in the industry, including photolithography of thin film metallization and plating to a required thickness.

Figure 3:
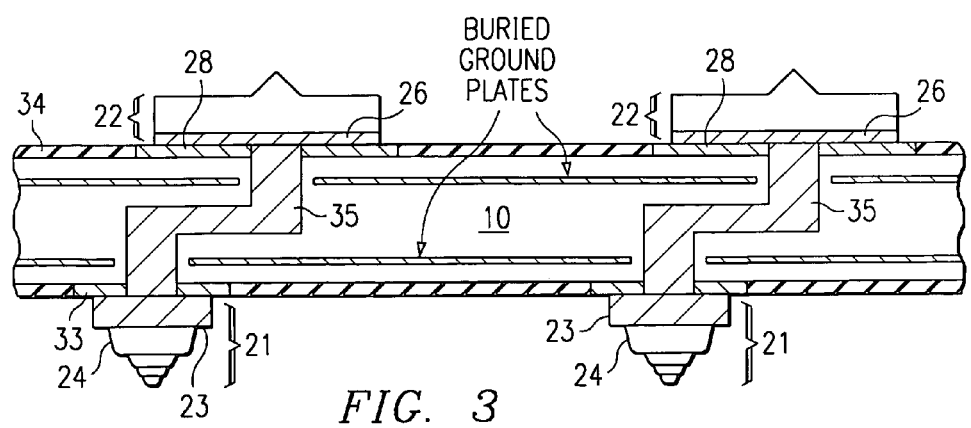
FIG. 3 is a cross section of a portion of a probe interposer with vias connecting chip contact elements to probe card connectors and pads.

On the opposite surface 112, a series of connectors 22 are arrayed in a pattern corresponding to universal or standardized connector pattern on a probe card. Each connector 22 includes a metal pad 26, and a connector element 25. The connector element is preferably a thicker metal feature capable of a pressure contact to provide electrical connection. Alternately, the connector element is an applied stud bump or micro spring connector. Connectors, pads may be positioned atop a layer of compliant material 28 recessed into the interposer, as was the case with chip contact elements, or alternately a compliant film 34 with vias as shown in FIG. 3. In yet another alternate embodiment, a compliant material is not necessary on the probe contact side of the interposer because the connectors themselves absorb the stresses sufficiently to avoid damage.

The conductive connectors 22 are aligned and brought into contact with the corresponding connector on the probe card. Mechanical mating of the connectors provides a very low contact resistance between the matched connectors.

Connectors 22 are most often offset from the corresponding chip contact element 21 in a manner which allows them to be directly aligned to a universal connector on a probe card. Off set and fan out on the interposer connectors 22 is accomplished both within the interposer by vias 35, and by routing of metal conductors on the surface of the interposer or compliant film covering the interposer surface. Some or all of the vias may be straight through the interposer with all routing made to the desired location by patterned metal conductors.

The interposer 10 is a dielectric material having a coefficient of thermal expansion in the range of 2 to 10 PPM, approaching that of the silicon wafer. The interposer ensures that positioning of the plurality of chip contact elements 21 upon the contact pads of the integrated circuit chips is maintained during thermal excursions, and as shown in FIG. 3 the interposer provides support for a plurality of vias 35 electrically connecting pads 23 on the first surface 111 to those 26 on the second surface 112. Technology for fabricating conductive vias and fine lines in organic media has become widely available, as a result of area array packaging, such as CSP (chip scale packages) or BGA (Ball Grid Arrays), and the circuit boards necessary to accommodate such devices. Further, multiple metal levels and planes which support common power and ground connections are routinely available. These buried metal levels also allow routing to off set and fan out connections from chip contacts 21 to connectors 22.

Figure 4:
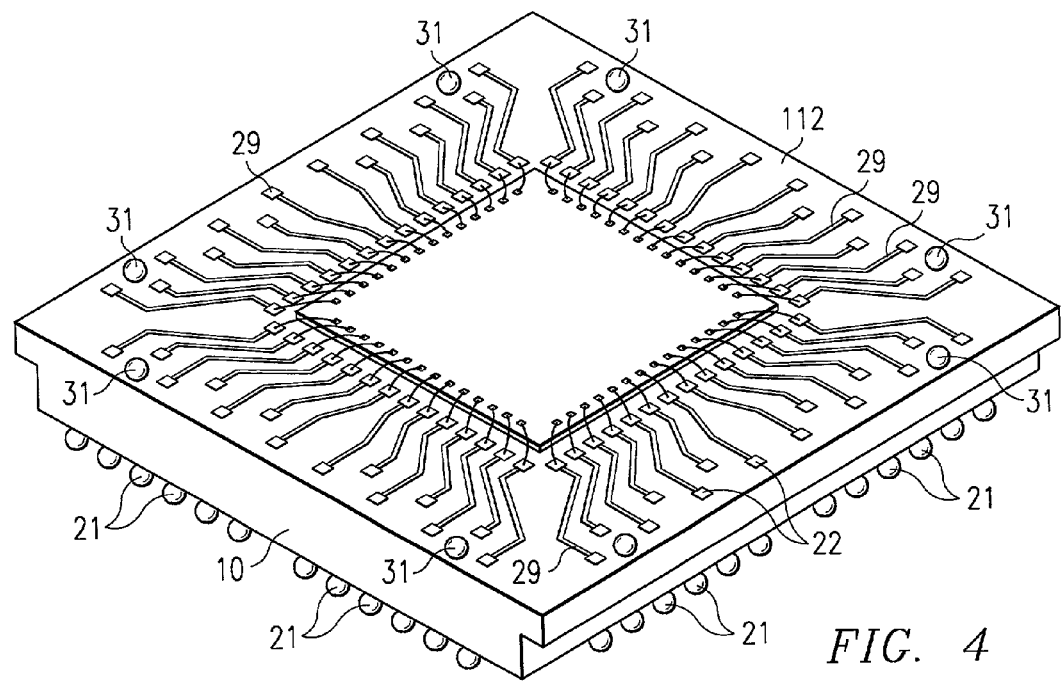
FIG. 4 is an example of the second surface of an interposer with traces to a universal connector pattern.

FIG. 4 is an example of an array of connectors 22 and leads 29 on the second surface 112 of an interposer 10 which provide connection for four (4) chip contacts 21 to a probe card. Leads 29 fan out from the egress of a via to the universal connector 22. In FIG. 4, it can be seen that there are four distinct patterns with most of the leads 29 fanned to the outer perimeter in order to allow contact by probe card connectors.

An array of apertures 31 are provided near the interposer perimeter for preferably screw type devices to secure the interposer 10 to probe card.

While the example illustrated in FIG. 4 is a two by two (2×2) chip array, it should be understood that the technology will be the same for other array configurations, and the number is limited largely by the ability to fan out leads so that probe contact can be made. It is expected that the arrays will be more readily accommodated in an "Y" by 2 deep arrangement.

Arrangement of the universal or standardized connector pattern on the interposer 10 to match that of a probe card is made by a combination of fanning the vias in an outward direction, and by final routing of leads 29 on the interposer surface 112 to the universal connectors specific location. Routing of leads 29 connecting the vias to connectors 22 is preferably made by coating the interposer surface with a highly conductive metal which can be etched chemically and by a fine beam laser, such as tin over copper. Features which are greater than 100 microns are preferably photolithographically defined using techniques common to printed circuit board and flex film industry with the finer features laser ablated. Alternately, the metal patterns are formed by laser ablation of the undesired metal. Electroless plating with a noble metal protects the metal leads and pads. In yet another embodiment, the leads are formed by photolithographic patterning of a thin film metal layer, etching, and subsequently plating the metal leads to the desired thickness.

High performance embodiments of the probe interposer are achieved by providing ground planes within the interposer, and/or by a customized design of leads wherein the dimensions are designed to provide or approach a specific impedance level.

Figure 5:
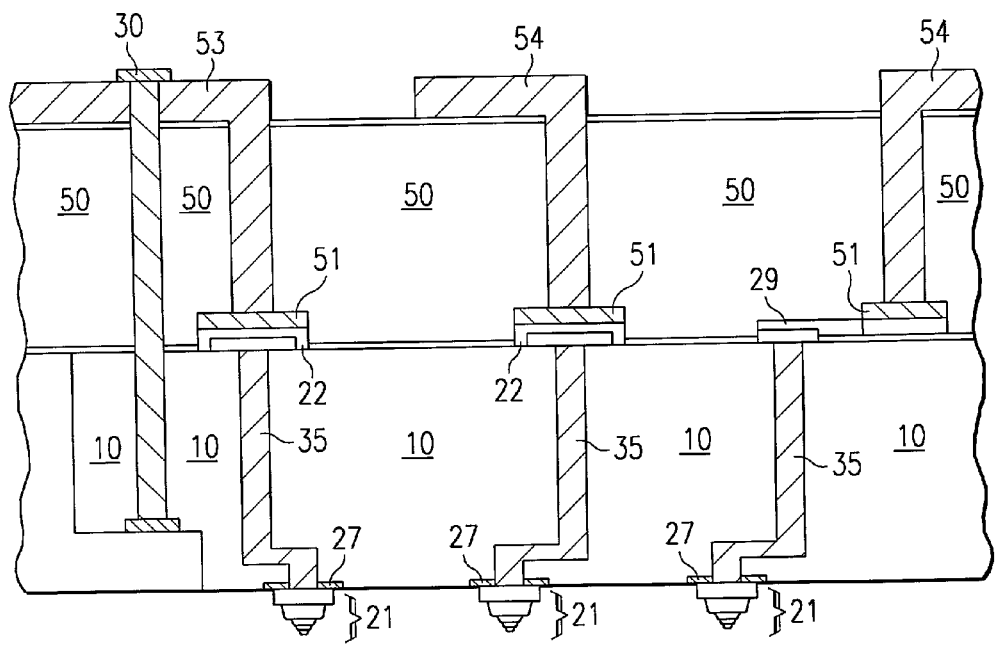
FIG. 5 is a detailed section of an interposer and card assemblage.

FIG. 5 is a cross section of a representative portion a probe card assemblage 100, including an interposer 10 with chip contact elements 21 atop a recessed compliant layer 27 on one surface, vias 35 connecting the chip contacts 21 to probe card connectors 22 on the second surface, and a probe card 50 with mating connectors 51 which correspond to those on the interposer.

The probe card 50 of the current invention, fabricated on a printed wiring board structure makes use of technology currently available throughout the probe card industry. The universal probe card 50 includes vias 53 to provide electrical connection between universal connectors 51 to the interposer, and conductive traces 54 on the opposite surface of the probe card. Metal traces 54 on the upper surface are conductors to which connections to the test equipment are made.

Connectors 51 on the probe card and those 22 on the interposer are arrayed in a universal or standardized pattern for a plurality of circuits to be tested. The location of connectors 51 on the card correspond with the connectors 22 on the interposer. A probe card with universal connectors allows a number of devices to be tested using the same card, by changing only the interposer with specific chip contacts. The universal probe card is specific to a particular type of test equipment.

Major components of the probe card assemblage, i.e., the interposer 10, and the probe card 50 are securely held by a series of fasteners, such as threaded screws 30 located near the perimeter of the interposer which provide a mechanical force between the connectors 22 on the interposer and the mating probe card connector 51. Alternately, the probe card and interposer can be secured together by a mechanical locking mechanism, such as a cam ring. The secure mechanical contact between connectors results in electrical connection between the components.

The probe card assemblage 100 functions by attaching an interposer 10 with standardized probe connectors 22 to a probe card 50 having mating connectors 51. Chip contact elements on the assemblage are aligned to the input/output pads of one or more chips a semiconductor wafer by use of microscopes with vision in both the up and down directions, prior to bring the probe head into contact. The probe card is connected to an appropriate tester by conventional connections. Application of ultrasonic pulses provides a means to erode surface oxide or contamination from the pads and contact elements so that the vertically oriented, robust chip contact elements of the probe assemblage make intimate contact to the chip pads without the need for excessive x-y motion, and therefore minimize damage to thin, fragile bond pads on ICs. Technology for ultrasonic abrasion has been previously disclosed in U.S. patent application Ser. No. 09/443,033, filed Nov. 18, 1999, and which is appended herein by reference.

Figure 6:
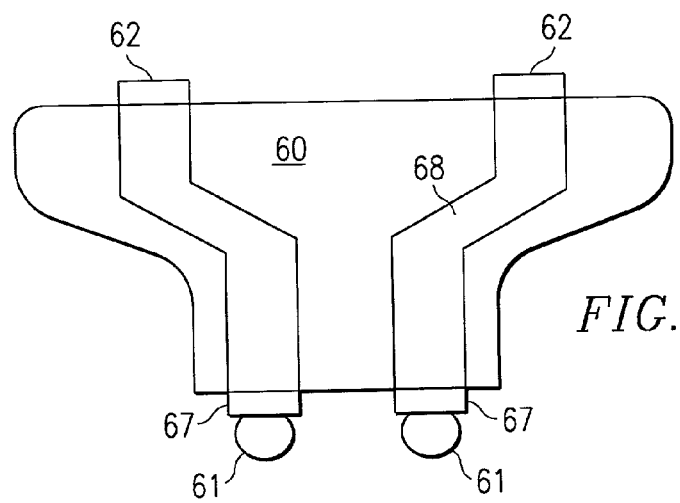
FIG. 6 is a cross section of a single chip interposer for press fit to a probe card.

The preferred embodiment of the probe card assemblage has been described and illustrated for multiple chip testing. However, the technology is applicable to single chip testing; the embodiment shown in FIG. 6 includes an interposer 60 with conductive vias 68 connecting chip contact elements 61 atop a compliant layer 67 on the first surface to a universal or standardized array of connectors 62 on the second surface. The interposer 60 is attached to a probe card (not shown) having an array of corresponding connectors. In one embodiment, the interposer is mechanically attached to the probe card by a threaded element, such as a machine screw recessed into the interposer, as illustrated in FIG. 5. In an alternate embodiment, the interposer having contoured edges, as shown in FIG. 6 is attached to the probe card by being positioned in an aperture or groove designed to correspond to the interposer size and shape and is press fit to make contact.

Figure 7A:
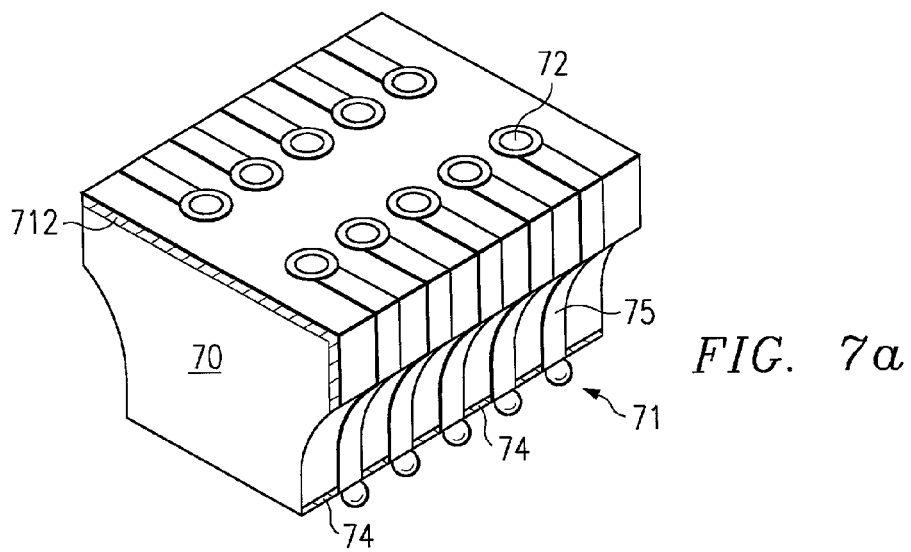
FIG. 7a is a robust single chip test probe interposer with edge connections.
Figure 7B:
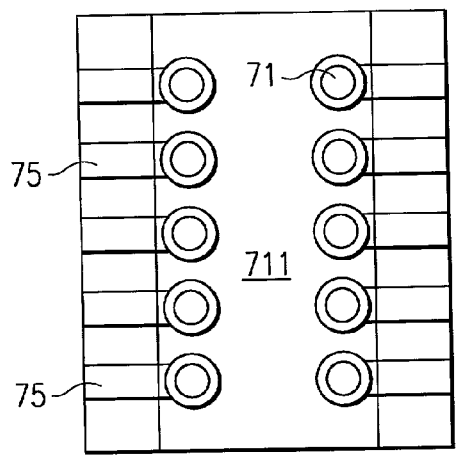
FIGS. 7b and 7c are top and bottom views of a single chip test probe interposer with edge connections.
Figure 7C:
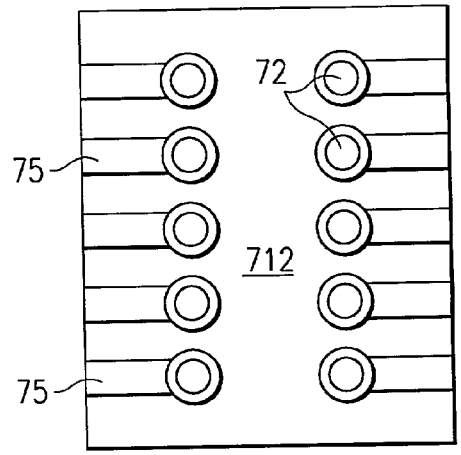

In yet another embodiment illustrated in FIG. 7a, a probe assemblage includes an array of robust chip contact elements 71 not unlike those previously described, attached to a series of conductive traces 75 formed on a compliant film 74, which in turn is secured to the interposer 70. Each trace forms a continuous lead following the vertical contour of the interposer, and connecting to a connector 72 on the second surface 712. The connectors 72 are arrayed in a pattern corresponding with an array of universal connectors on a probe card. The interposer 70 with contoured edges snaps, or is press fit into a probe card (not shown). Preferably, the metal traces 75 are formed by patterning and etching, coupled with laser ablation of a highly conductive, ductile metal, such as copper. FIGS. 7b and 7c illustrates the first 711 and second surface 712 respectively of the interposer with chip contact elements 71, probe card connectors 72, and connecting metal traces 75.

The robust chip contact elements of each of the embodiments described are applicable to full chip testing of the input/output pads on a chip or chips, as well as to testing process control or other test structures placed in scribe lines on the semiconductor wafer.

The probe assemblage of the current invention is fabricated by combining individual process steps known throughout the industry. While a preferred method includes the following series of steps, the invention is in no way limited to this combination, but may include alternatives and modifications as known in the industry.

The assemblage for providing simultaneous probe contact between one of more integrated circuit chips to a test equipment is preferably fabricated by (a) providing an dielectric interposer having thermal expansion characteristics similar to that of silicon, which includes a plurality of conductive vias arrayed to correspond to the pitch of chip contact pads, and which extend from the first major surface to the second major surface of the interposer, (b) providing a compliant material under the position of chip contact elements, {c} depositing a layer of highly conductive metal on each major surface, {d} patterning and etching the conductor designs greater than 100 microns, (e) laser ablating the conductors less than about 100 microns, as well as excess unetched metal on both surfaces, (f) bonding a chip contact element to each patterned contact pad on the first surface, and a connector element on the terminal of each lead on the second surface, (g) providing a probe card having a mating connector to that on said interposer, and (h) aligning said connectors, and locking or screwing the major components to provide electrical contact. Conductor patterns formed in step (d) and e) include on the first surface an array of pads corresponding to chip contact pads on the first surface, and any necessary conductive leads to vias, and on the second surface an array of pads at the via egress point and an array of conductive leads terminating in a standardized pattern of pads for connectors.

The current invention provides a number of innovative advantages to the semiconductor industry. Testing multiple chips simultaneously has a significant impact on cycle time for device completion, and on expensive test equipment time. Robust, and dense contact elements on the interposer lower the cost of and lessen maintenance on probe contacts, and the method of manufacture lends itself to relatively low cost and rapid cycle time, necessary to respond to the fast paced introduction of chip designs for both new and revised products. Software input of the critical pad location and dimensions are based precisely on that of the chip design, and use of noble metal contacts minimizes the amount of scrubbing or over-travel required to break oxides on the aluminum bond pads and to make excellent electrical contact. The use of ultrasonic energy effectively allows vertical contact with minimal scrubbing, a feature necessary for testing multiple chips simultaneously. The universal probe card usable for multiple circuits with connectors mating to those on the interposer provides a reduction in set-up time, and in the cost of probe cards.

While the invention has been described with reference to specific embodiments, it is not intended to limit the scope to a particular form set forth, but on the contrary, it is intended to cover alternatives, modifications, and equivalents as may be included within the spirit of the invention described by the appended claims.

What is claimed is:

1. A probe assemblage for providing electrical connection simultaneously between one or more integrated circuits on a semiconductor wafer and a circuit test equipment, said assemblage including:

an interposer comprising a dielectric material having two major surfaces, a plurality of protruding contact elements on one major surface of said interposer, each element corresponding to a test pad on one or more integrated circuits, a plurality of conductive vias connecting each of said contact elements to a metallized pad on the second surface of said interposer, a plurality of conductive leads fanning outward from said metallized pads to a standardized array of interposer connectors, a compliant material underlying said contact elements on the first surface, and/or said interposer connectors on the second surface of the interposer, a probe card having an array of connectors corresponding to said interposer connector array, and means for attaching said probe card to said interposer.

2. An assemblage as in claim 1 wherein said protruding contact elements comprise a noble or oxide limiting metal.

3. An assemblage as in claim 1 wherein said protruding contact elements are stud bumps.

4. An assemblage as in claim 1 wherein said contact elements are microwires.

5. An assemblage as in claim 1 wherein the interposer has a coefficient of thermal expansion in the range of 2 to 10 PPM.

6. An assemblage as in claim 1 wherein said interposer includes one or more buried metal ground planes.

7. An assemblage as in claim 1 wherein said pads and conductive leads on the interposer comprise a first layer of copper and second layer of a laser ablatable material.

8. An assemblage as in claim 1 wherein said pads and conductive leads on the interposer are patterned by laser ablation in combination with chemical etching.

9. An assemblage as in claim 1 wherein the pattern for the conductive leads and pads is software generated and input to a laser.

10. An assemblage as in claim 1 wherein said chip contact elements are spaced more closely than the probe card connectors.

11. An assemblage as in claim 1 wherein said connectors on the the second surface of the interposer mate to an array of connectors on a probe card.

12. An assemblage as in claim 1 wherein said connectors on the probe card are arrayed in a universal pattern common to multiple circuit devices.

13. An assemblage as in claim 1 wherein said means to attach the interposer to the probe card is a plurality of threaded machine screws.

14. A method of forming an assemblage for simultaneously providing electrical connection between one or more integrated circuits on a semiconductor wafer and a circuit tester, including the following steps:

providing an dielectric interposer having thermal expansion characteristics similar to that of silicon, and having a plurality of conductive vias at locations corresponding to the distance between chip contact pads which extending from the first major surface to the second major surface of the interposer, affixing a layer of highly conductive metal on each major surface, patterning an array of pads corresponding to chip contact pads on the first surface, patterning an array of pads at the via egress point on the second surface and an array of conductive leads terminating in a standardized pattern, bonding a chip contact element to each patterned contact pad on the first surface, and a connector element on the terminal of each lead on the second surface, providing a compliant material layer underlying the chip contact elements, and/or probe connector on the interposer, providing a probe card having a mating connector to that on said interposer, and aligning said connectors, and mechanically attaching.

15. A method as in claim 14 wherein said patterns on the interposer surface are generated by using a software and a computer controlled laser.

16. A method as in claim 14 wherein said metal patterns are formed by at least partially by laser ablation.

17. A method as in claim 14 wherein said metal patterns are formed by photolithography and chemical etching.

* * * * *